US012713637B2

(12) United States Patent
Lin et al.

(10) Patent No.: US 12,713,637 B2
(45) Date of Patent: Aug. 18, 2026

(54) SEMICONDUCTOR DEVICE HAVING NANOSTRUCTURE TRANSISTOR AND METHODS OF FABRICATION THEREOF

(71) Applicant: TAIWAN SEMICONDUCTOR MANUFACTURING COMPANY, LTD., Hsinchu (TW)

(72) Inventors: Wen-Kai Lin, Yilan (TW); Che-Hao Chang, Hsinchu (TW); Yoh-Rong Liu, Taipei (TW); Zhen-Cheng Wu, Taichung (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1139 days.

(21) Appl. No.: 17/739,078

(22) Filed: May 7, 2022

(65) Prior Publication Data

US 2023/0361201 A1 Nov. 9, 2023

(51) Int. Cl.

| | |
|---|---|
| ***H01L 21/02*** | (2006.01) |
| ***H01L 29/66*** | (2006.01) |
| ***H10D 30/01*** | (2025.01) |
| ***H10D 30/67*** | (2025.01) |
| ***H10D 62/10*** | (2025.01) |
| ***H10D 64/01*** | (2025.01) |
| ***H10P 14/20*** | (2026.01) |
| ***H10P 14/60*** | (2026.01) |

(52) U.S. Cl.
CPC ....... *H10D 30/031* (2025.01); *H10D 30/6735* (2025.01); *H10D 30/6757* (2025.01); *H10D 62/118* (2025.01); *H10D 64/017* (2025.01); *H10D 64/018* (2025.01); *H10P 14/3452* (2026.01); *H10P 14/6308* (2026.01); *H10P 14/6319* (2026.01)

(58) Field of Classification Search
CPC ............. H10D 30/031; H10D 30/6757; H10D 30/6735; H10D 64/018; H10D 64/017; H10D 62/118; H01L 21/02236; H01L 21/02252; H10P 14/6319; H10P 14/3452; H10P 14/6308
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |

(Continued)

*Primary Examiner* — Walter H Swanson
(74) *Attorney, Agent, or Firm* — NZ Carr Law Office

(57) ABSTRACT

Embodiments of the present disclosure provide a method for forming a semiconductor device structure. In one embodiment, the method includes forming a fin structure having first semiconductor layers and second semiconductor layers alternatingly stacked, removing edge portions of the second semiconductor layers to form cavities between adjacent first semiconductor layers, selectively forming a passivation layer on sidewalls of the first semiconductor layers, forming a dielectric spacer on sidewalls of the second semiconductor layers and filling in the cavities, wherein the passivation layer is exposed. The method also includes removing the passivation layer, and forming an epitaxial source/drain feature so that the epitaxial source/drain feature is in contact with the first semiconductor layers and the dielectric spacers.

20 Claims, 14 Drawing Sheets

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2018/0026033 | A1 | 1/2018 | Chang et al. |
| 2020/0006155 | A1* | 1/2020 | Chiang .............. H10D 84/0193 |
| 2020/0052132 | A1 | 2/2020 | Ching et al. |
| 2021/0367032 | A1* | 11/2021 | Chen .................... H10D 30/024 |

* cited by examiner 100
146
101
Y
Z
118

100
136
134
132
101
130
Y
Z
118
106
108
106
108
106
108
116

136
138
134
132
144
146
101
130
X
Z
100
146
106
108
106
108
106
108
144

SEMICONDUCTOR DEVICE HAVING NANOSTRUCTURE TRANSISTOR AND METHODS OF FABRICATION THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenge. For example, transistors using nanostructure channels have been proposed to improve carrier mobility and drive current in a device. An inner spacer is often disposed between metal gate and source/drain (S/D) structure to protect the S/D structure from damage that may occur during the subsequent gate replacement process. Although the formation of the inner spacer has been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10A-15A are cross-sectional side views of various stages of manufacturing the semiconductor device structure taken along cross-section A-A of FIG. 6, in accordance with some embodiments.

FIGS. 10B-15B are cross-sectional side views of various stages of manufacturing the semiconductor device structure taken along cross-section B-B of FIG. 6, in accordance with some embodiments.

FIG. 10C-15C are cross-sectional side views of various stages of manufacturing the semiconductor device structure taken along cross-section C-C of FIG. 6, in accordance with some embodiments.

DETAILED DESCRIPTION

Figure 1:
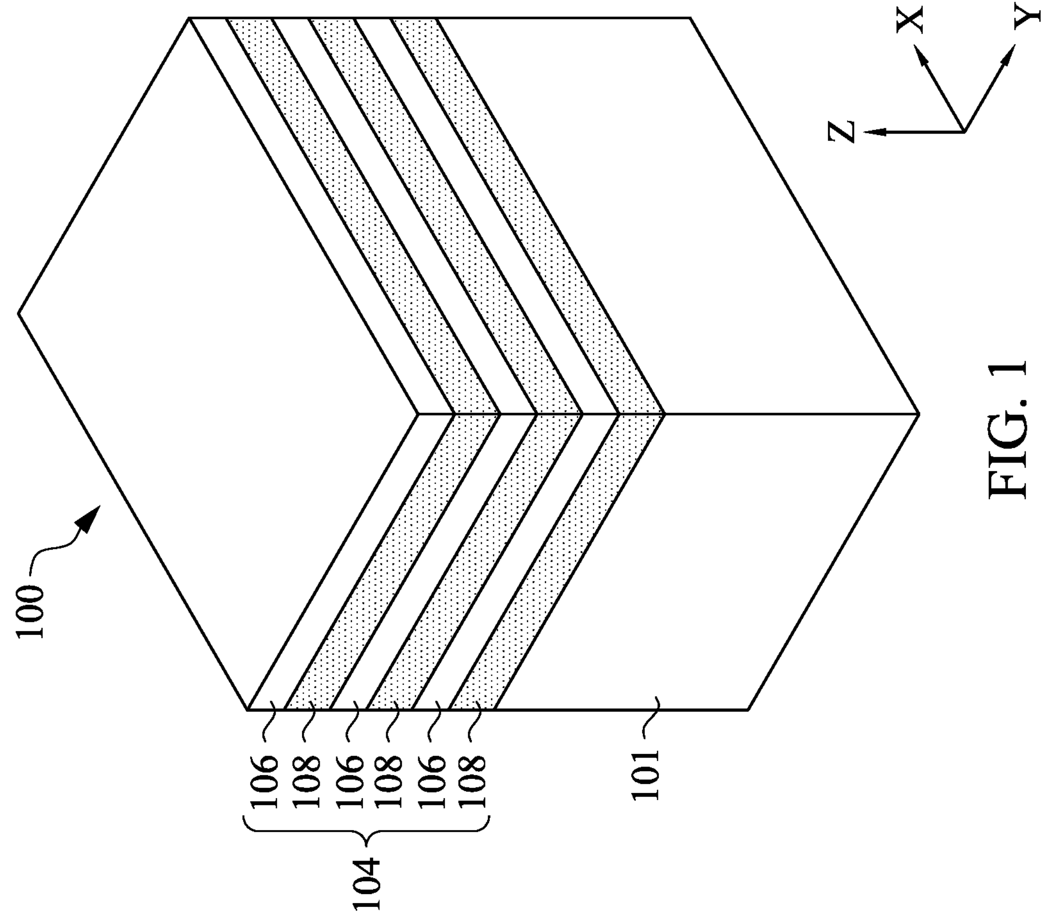
FIGS. 1-6 are perspective views of various stages of manufacturing a semiconductor device structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanostructure channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-15C show exemplary processes for manufacturing a semiconductor device structure 100 according to embodiments of the present disclosure. It is understood that additional operations can be provided before, during, and after processes shown by FIGS. 1-15C, and some of the operations described below can be replaced or eliminated, for additional embodiments of the method. The order of the operations/processes is not limiting and may be interchangeable.

FIGS. 1-6 are perspective views of various stages of manufacturing a semiconductor device structure 100 in accordance with some embodiments. As shown in FIG. 1, a semiconductor device structure 100 includes a stack of semiconductor layers 104 formed over a front side of a substrate 101. The substrate 101 may be a semiconductor substrate. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having p-type or n-type conductivity). Depending on circuit design, the dopants may be, for example boron for p-type field effect transistors (PFET) and phosphorus for n-type field effect transistors (NFET).

The stack of semiconductor layers 104 includes semiconductor layers made of different materials to facilitate formation of nanostructure channels in a multi-gate device, such as nanostructure FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108, and the first and second semiconductor layers 106, 108 are disposed parallelly with each other. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of Si doped with Ge and the second semiconductor layers 108 may be made of SiGe. In some examples, the first semiconductor layers 106 may be made of SiGe and the second semiconductor layers 108 may be made of Si. In some embodiments, the first semiconductor layers 106 may be made of SiGe having a first Ge concentration range, and the second semiconductor layers 108 may be made of SiGe having a second Ge concentration range that is lower or greater than the first Ge concentration range. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The thickness of the first semiconductor layers 106 and the second semiconductor layers 108 may vary depending on the application and/or device performance considerations. In some embodiments, each first and second semiconductor layer 106, 108 has a thickness in a range between about 5 nm and about 30 nm. In other embodiments, each first and second semiconductor layer 106, 108 has a thickness in a range between about 10 nm and about 20 nm. In some embodiments, each first and second semiconductor layer 106, 108 has a thickness in a range between about 6 nm and about 12 nm. Each second semiconductor layer 108 may have a thickness that is equal to, less than, or greater than the thickness of the first semiconductor layer 106. The second semiconductor layers 108 may eventually be removed and serve to define a vertical distance between adjacent channels for the semiconductor device structure 100.

The first semiconductor layers 106 or portions thereof may form nanostructure channel(s) of the semiconductor device structure 100 in later fabrication stages. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanostructure channel(s) of the semiconductor device structure 100 may be surrounded by a gate electrode. The semiconductor device structure 100 may include a nanostructure transistor. The nanostructure transistors may be referred to as nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes. While three first semiconductor layers 106 and three second semiconductor layers 108 are alternately arranged as illustrated in FIG. 1, it can be appreciated that any number of first and second semiconductor layers 106, 108 can be formed in the stack of semiconductor layers 104, depending on the predetermined number of nanostructure channels for each FET. For example, the number of first semiconductor layers 106, which is the number of channels, may be between 2 and 8.

Figure 2:
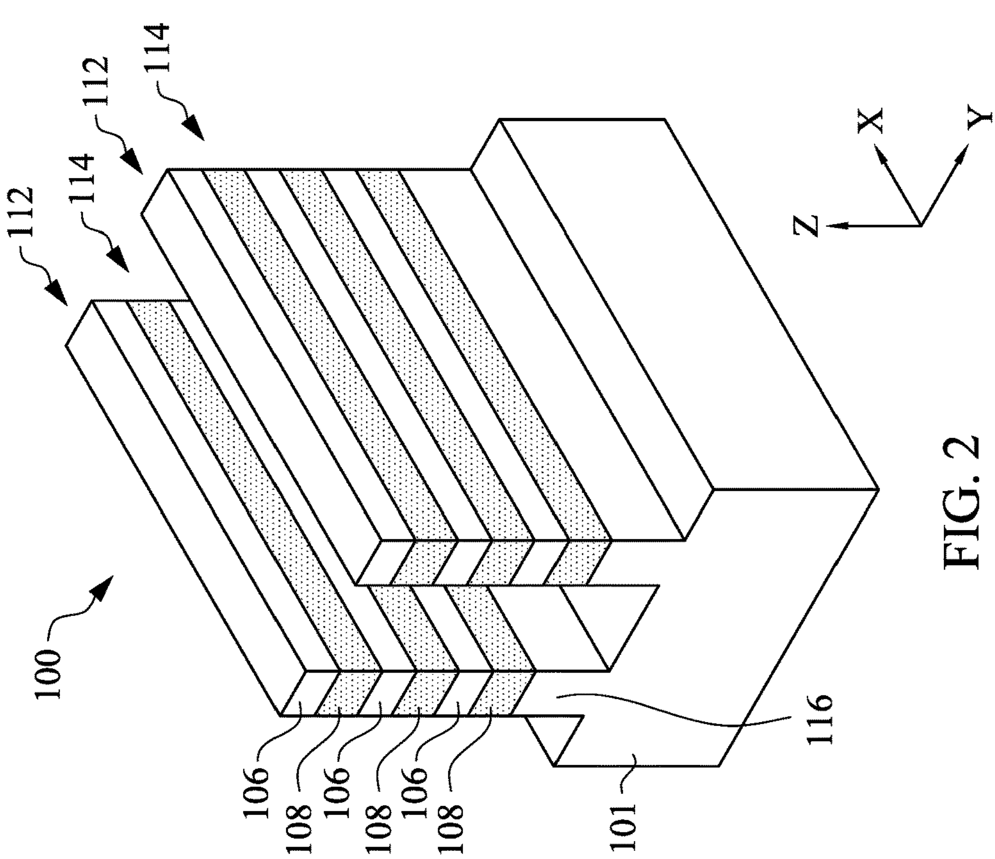

In FIG. 2, fin structures 112 are formed from the stack of semiconductor layers 104. Each fin structure 112 has an upper portion including the semiconductor layers 106, 108 and a well portion 116 formed from the substrate 101. The fin structures 112 may be formed by patterning a hard mask layer (not shown) formed on the stack of semiconductor layers 104 using multi-patterning operations including photo-lithography and etching processes. The etching process can include dry etching, wet etching, reactive ion etching (RIE), and/or other suitable processes. The photo-lithography process may include forming a photoresist layer (not shown) over the hard mask layer, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The etching process forms trenches 114 in unprotected regions through the hard mask layer, through the stack of semiconductor layers 104, and into the substrate 101, thereby leaving the plurality of extending fin structures 112. The trenches 114 extend along the X direction. The trenches 114 may be etched using a dry etch (e.g., RIE), a wet etch, and/or combination thereof.

Figure 3:
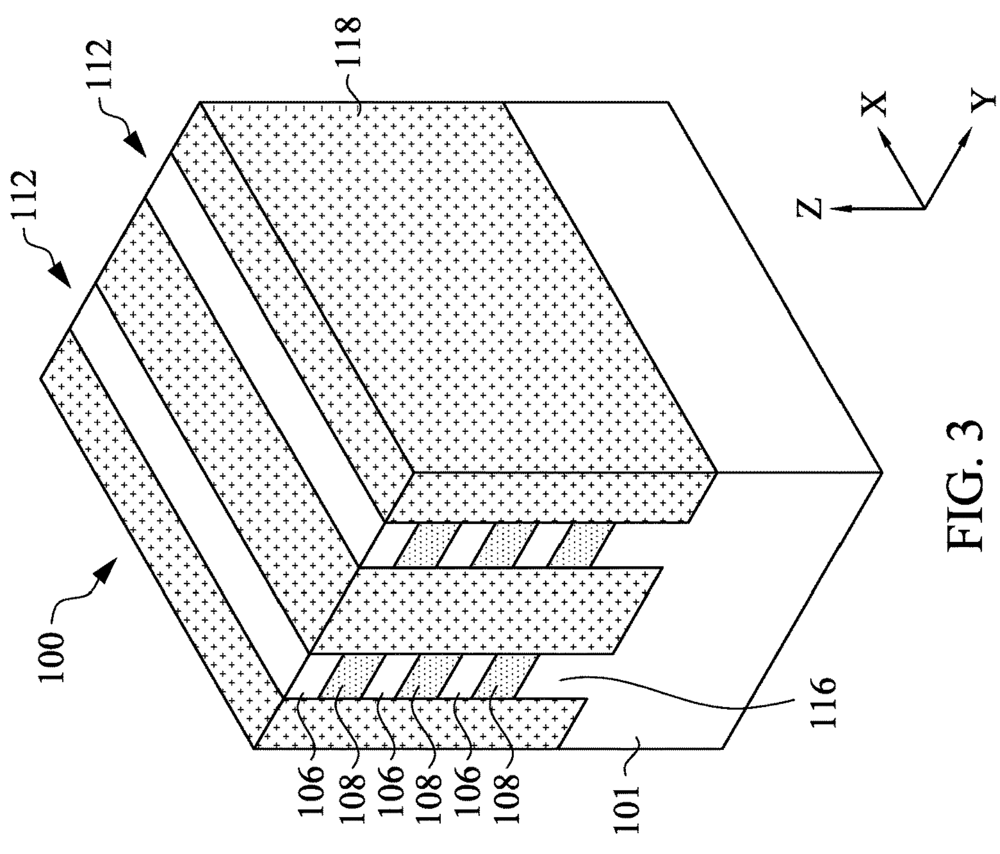

In FIG. 3, after the fin structures 112 are formed, an insulating material 118 is formed on the substrate 101. The insulating material 118 fills the trenches 114 (FIG. 2) between neighboring fin structures 112 until the fin structures 112 are embedded in the insulating material 118. Then, a planarization operation, such as a chemical mechanical polishing (CMP) method and/or an etch-back method, is performed such that the top of the fin structures 112 is exposed. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Figure 4:
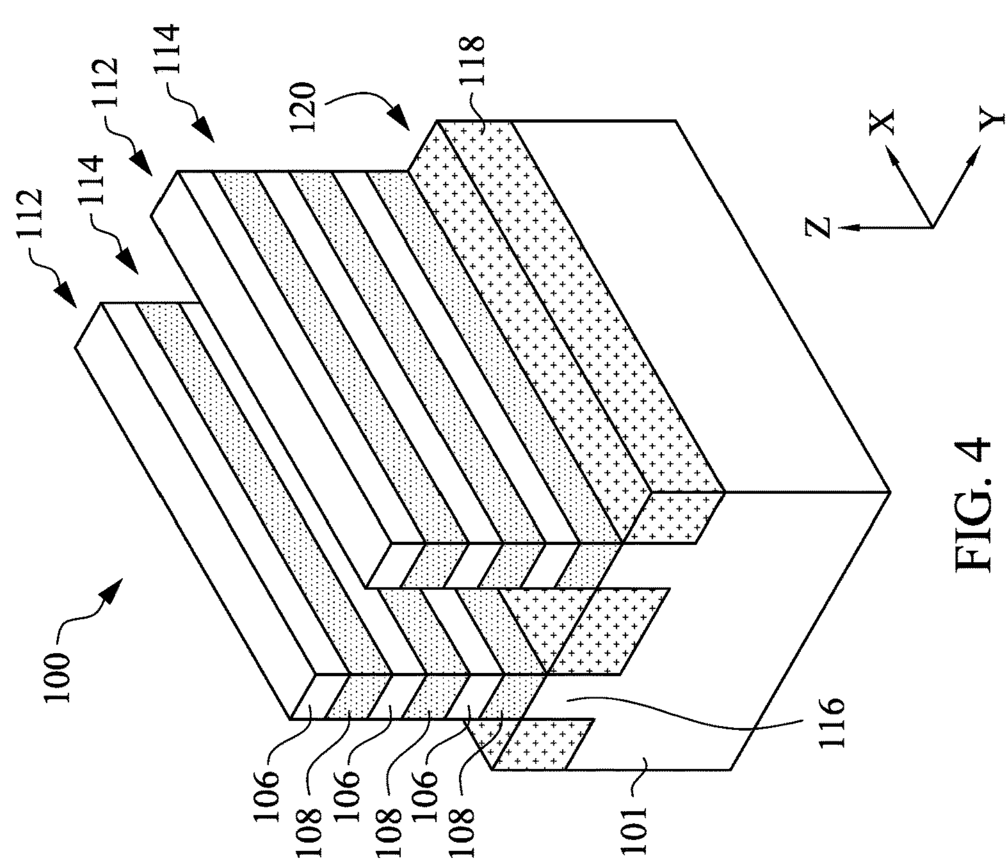

In FIG. 4, the insulating material 118 is recessed to form an isolation region 120. The recess of the insulating material 118 exposes portions of the fin structures 112, such as the stack of semiconductor layers 104. The recess of the insulating material 118 reveals the trenches 114 between the neighboring fin structures 112. The isolation region 120 may be formed using a suitable process, such as a dry etching process, a wet etching process, or a combination thereof. A top surface of the insulating material 118 may be level with or below a surface of the second semiconductor layers 108 in contact with the well portion 116 formed from the substrate 101.

Figure 5:
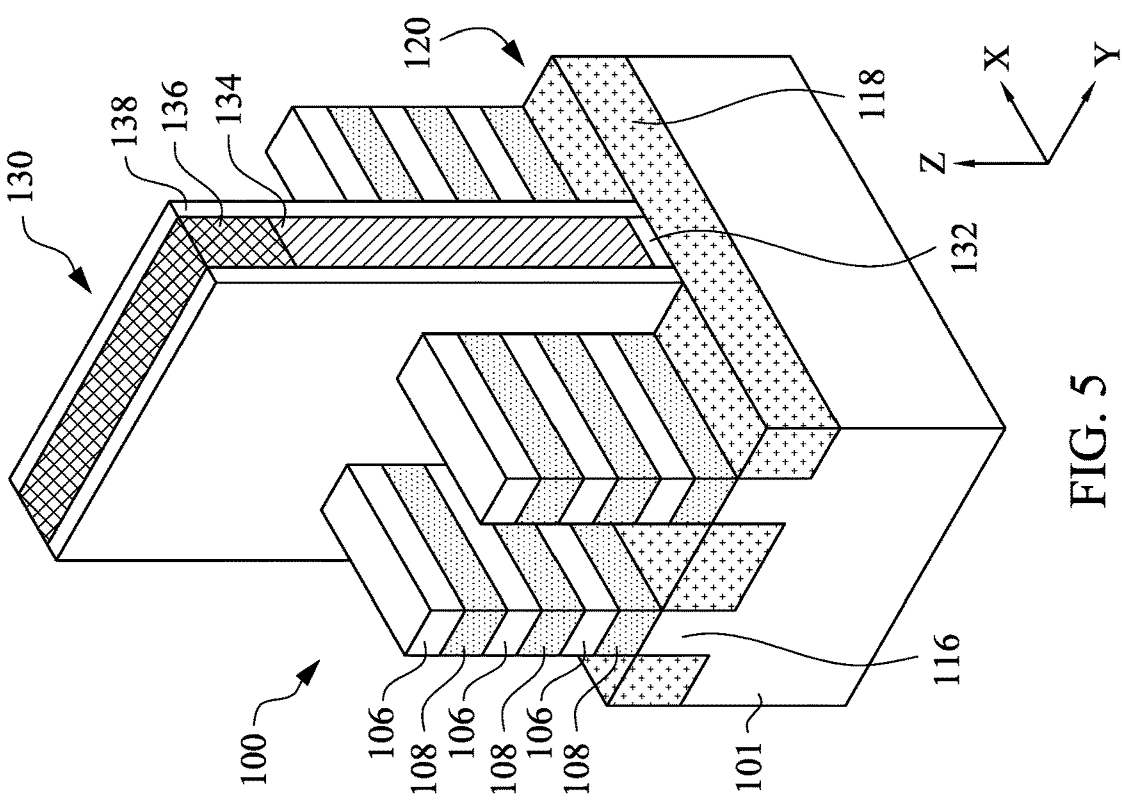

In FIG. 5, one or more sacrificial gate structures 130 are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, and then patterning those layers into the sacrificial gate structures 130. Gate spacers 138 are then formed on sidewalls of the sacrificial gate structures 130. The gate spacers 138 may be formed by conformally depositing one or more layers for the gate spacers 138 and anisotropically etching the one or more layers, for example. While one sacrificial gate structure 130 is shown, two or more sacrificial gate structures 130 may be arranged along the X direction in some embodiments.

The sacrificial gate dielectric layer 132 may include one or more layers of dielectric material, such as a silicon oxide-based material. The sacrificial gate electrode layer 134 may include silicon such as polycrystalline silicon or amorphous silicon. The mask layer 136 may include more than one layer, such as an oxide layer and a nitride layer. The gate spacer 138 may be made of a dielectric material such as silicon oxide, silicon nitride, silicon carbide, silicon oxynitride, SiCN, silicon oxycarbide, SiOCN, and/or combinations thereof.

The portions of the fin structures 112 that are covered by the sacrificial gate electrode layer 134 of the sacrificial gate structure 130 serve as channel regions for the semiconductor device structure 100. The fin structures 112 that are partially exposed on opposite sides of the sacrificial gate structure 130 define source/drain (S/D) regions for the semiconductor device structure 100. In some cases, some S/D regions may be shared between various transistors. For example, various one of the S/D regions may be connected together and implemented as multiple functional transistors.

Figure 6:
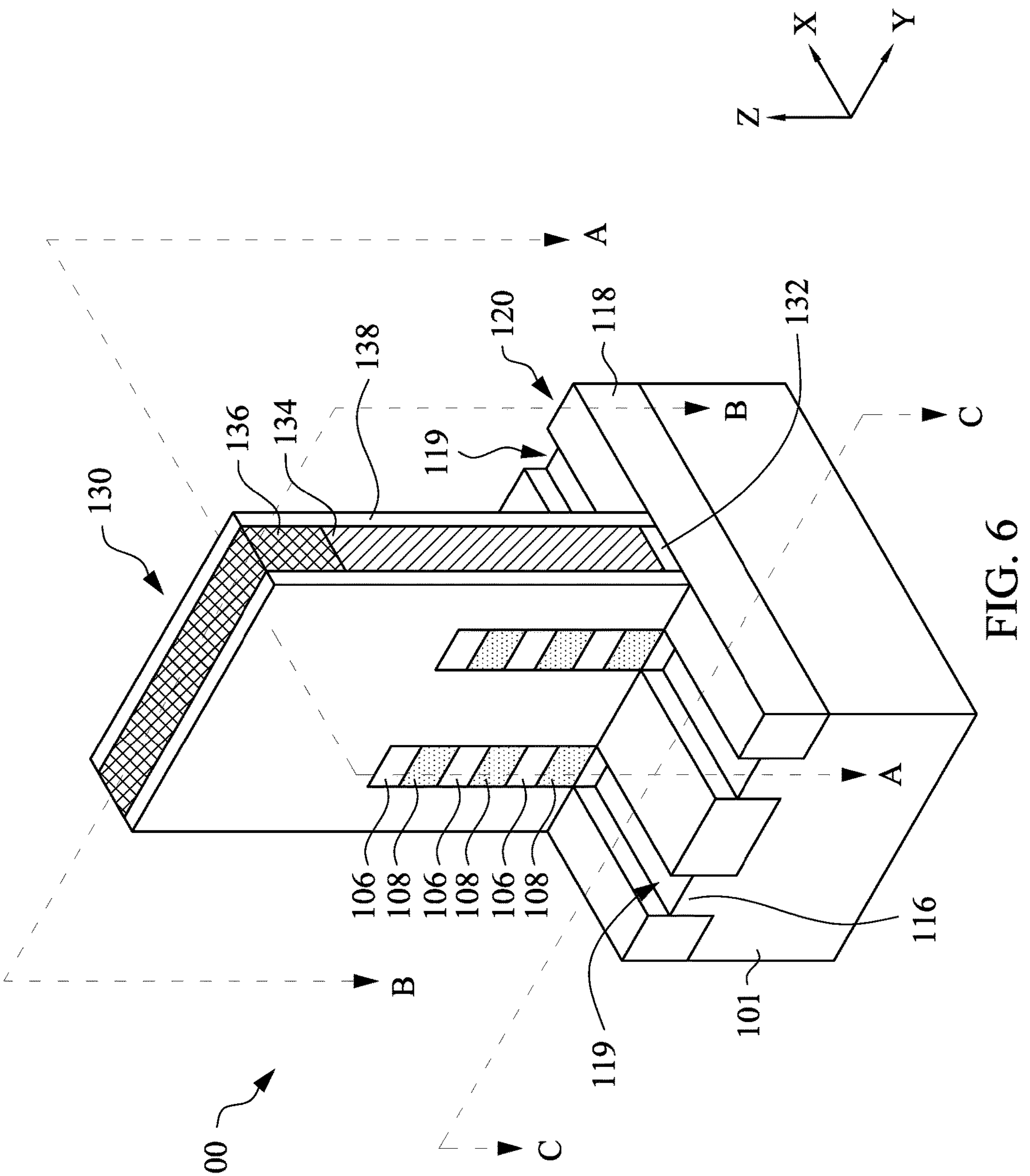

In FIG. 6, the portions of the fin structures 112 in the S/D regions (e.g., regions on opposite sides of the sacrificial gate structure 130) are recessed down below the top surface of the isolation region 120 (or the insulating material 118), by removing portions of the fin structures 112 not covered by the sacrificial gate structure 130. The recess of the portions of the fin structures 112 can be done by an etch process, either isotropic or anisotropic etch process, or further, may be selective with respect to one or more crystalline planes of the substrate 101. The etch process may be a dry etch, such as a RIE, NBE, or the like, or a wet etch, such as using tetramethyalammonium hydroxide (TMAH), ammonium hydroxide ($NH_4OH$), or any suitable etchant. Trenches 119 are formed in the S/D regions as the result of the recess of the portions of the fin structures 112.

Figures 7A, 7B, 7C:
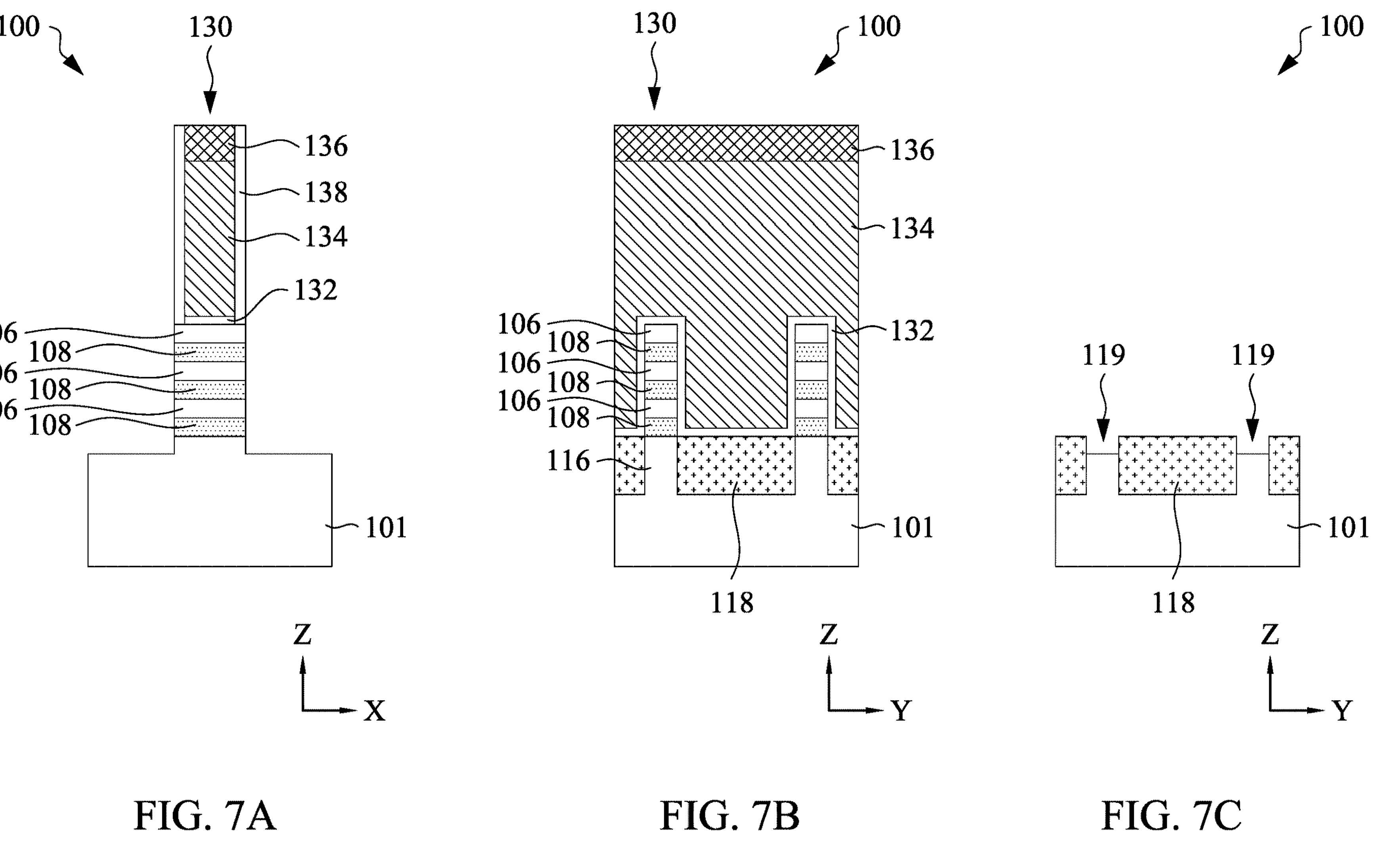
FIGS. 7A, 7B, and 7C are cross-sectional side views of the semiconductor device structure taken along line A-A, line B-B, and line C-C of FIG. 6, respectively.

FIGS. 7A, 7B, and 7C are cross-sectional side views of the semiconductor device structure 100 taken along line A-A, line B-B, and line C-C of FIG. 6, respectively. Cross-section A-A is in a plane of the fin structure 112 along the X direction. Cross-section B-B is in a plane perpendicular to cross-section A-A and is in the sacrificial gate structure 130. Cross-section C-C is in a plane perpendicular to cross-section A-A and is in the S/D epitaxial features 146 (FIG. 10A) along the Y-direction.

Figure 8B:
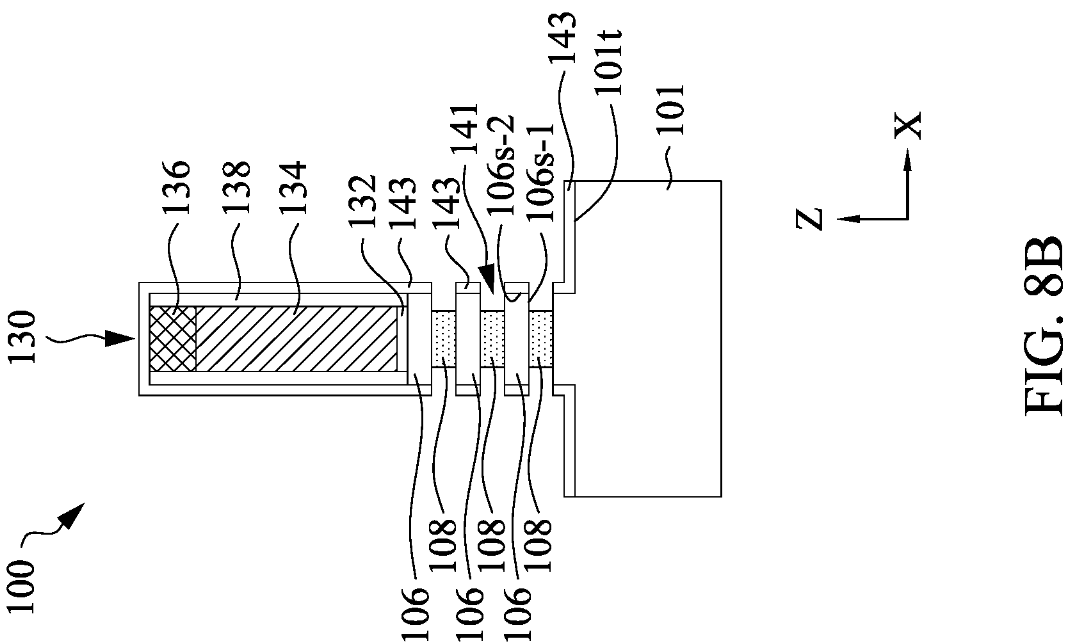
FIGS. 8A-8D are cross-sectional side views of the semiconductor device structure taken along line A-A of FIG. 6, showing various stages of manufacturing the semiconductor device structure in accordance with some embodiments.
Figure 8A:
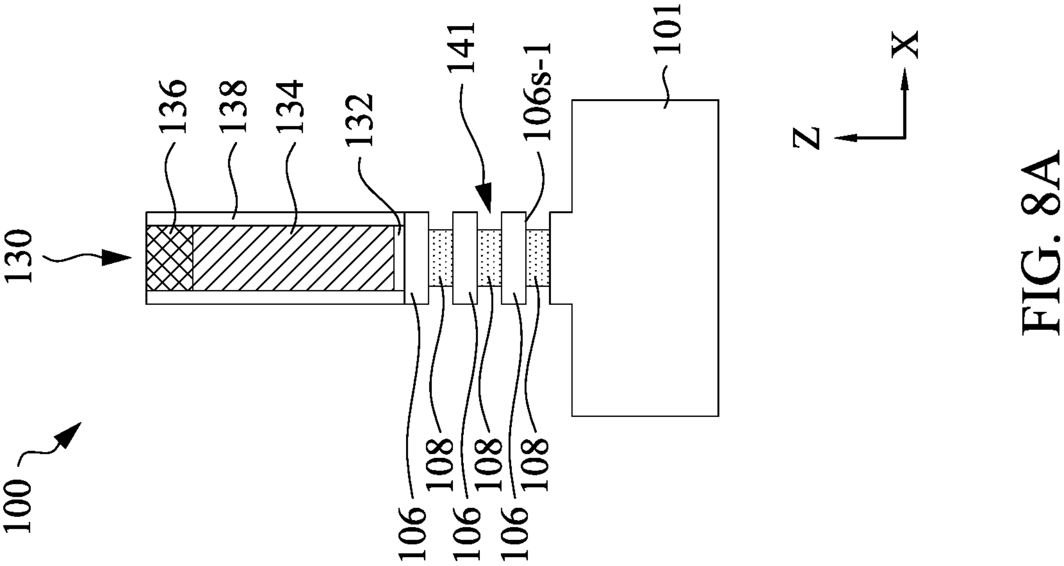

FIGS. 8A-8D are cross-sectional side views of the semiconductor device structure 100 taken along line A-A of FIG. 6, showing various stages of manufacturing the semiconductor device structure 100 in accordance with some embodiments. In FIG. 8A, edge portions of each second semiconductor layer 108 of the stack of semiconductor layers 104 are removed horizontally along the X direction. The removal of the edge portions of the second semiconductor layers 108 forms cavities 141. In some embodiments, the portions of the second semiconductor layers 108 are removed by a selective wet etching process. In cases where the second semiconductor layers 108 are made of SiGe and the first semiconductor layers 106 are made of silicon, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. The removal of edge portions of the second semiconductor layers 108 expose a portion of first side surfaces 106*s*-1 of the first semiconductor layers 106 along the X direction.

In FIG. 8B, after the removal of edge portions of the second semiconductor layers 108, a passivation layer 143 is formed on the gate spacers 138, the mask layer 136, and second side surfaces 106*s*-2 (e.g., sidewalls) of the first semiconductor layers 106 along the Z direction. In some embodiments, the passivation layer 143 is selectively formed on the gate spacers 138, the mask layer 136, and the second side surfaces 106*s*-2, with little or no passivation layer on the first side surfaces 106*s*-1 of the first semiconductor layers 106 due to the narrow spacing between the adjacent first semiconductor layers 106. In some embodiments, the passivation layer 143 is further formed on a top surface 101*t* of the substrate 101. The passivation layer 143 serves as an inhibitor to prevent the subsequent dielectric spacers 144 (FIG. 8C) from forming on the sacrificial gate structure 130, the top surface 101*t* of the substrate 101, and the second side surfaces 106*s*-2 of the first semiconductor layers 106. The formation of the passivation layer 143 also creates surfaces distinctive from the exposed surfaces of the second semiconductor layers 108 for selective deposition of the subsequent dielectric spacers 144. Therefore, the dielectric spacers 144 can be selectively formed within the cavities 141 and in contact with the second semiconductor layers 108 and the first side surfaces 106*s*-1 of the first semiconductor layers 106. In various embodiments, the passivation layer 143 is configured so that they can be easily removed without damaging the dielectric spacers 144 during subsequent removal of the passivation layers 143.

The passivation layer 143 may be formed by subjecting the first semiconductor layers 106 to a plasma treatment. The formation of the passivation layer 143 allows the precursors used for subsequent dielectric spacers 144 to selectively react with the second semiconductor layers 108 but not the passivation layer 143. In various embodiments, the plasma treatment may be performed by exposing at least the exposed surfaces of the first semiconductor layers 106 (e.g., second side surfaces 106*s*-2) to an oxygen-based plasma, a halogen-based plasma, such as a chlorine-based plasma, a fluorine-based plasma, a bromine-based plasma, or a combination thereof. In one embodiment, the plasma treatment uses an oxygen-based plasma. In another embodiment, the plasma treatment uses a chlorine-based plasma. In yet another embodiment, the plasma treatment uses a fluorine-based plasma.

In cases where oxygen-based plasma is used, the passivation layer 143 may be an oxide layer (e.g., silicon oxide or silicon oxynitride) that is formed on the second side surfaces 106*s*-2 of the first semiconductor layers 106 as a result of the plasma treatment. In some embodiments, the oxygen of the passivation layer 143 may diffuse into the first semiconductor layers 106 during the subsequent manufacturing process (e.g., formation of the dielectric spacers 144). In such cases, a surface portion (e.g., surface portion 117*a-c* shown in FIGS. 9A-9C) of the first semiconductor layers 106 may have about 0 atomic percentage of oxygen to about 10 atomic percentage of oxygen, such as about 2-8 atomic percentage of oxygen. It is understood that the surface portion 117*a-c* may be the portion of the first semiconductor layers 106 to be in contact with the epitaxial S/D feature 146. The passivation layer 143 may have a thickness (along the X direction) of, for example, one atomic layer to several atomic layers. In some embodiments, a surface portion of the first semiconductor layers 106 of the second side surfaces 106*s*-2 is oxidized and converted to a dielectric region as a result of the plasma treatment. The plasma treatment may be any suitable plasma process, such as a decoupled plasma oxidation process, a remote plasma oxidation process, a decoupled plasma process using oxygen-containing and nitrogen-containing precursors, or any combination thereof. The use of decoupled plasma may be advantageous since the power is separated into a source power, which is a high power supplied to a chamber wall (of a process chamber in which a substrate, e.g., the substrate 101, is disposed), and a bias power, which is connected to the substrate (and thus the fin structure 112). The source power ionizes the precursors supplied to the process chamber and generates the reactive species in the process chamber. The bias power on the substrate 101 drives the reactive species towards the substrate 101 and thus provides better control of the reaction rate. In some embodiments, process conditions, such as the chamber pressure and the bias power, may be controlled so that the reactive species are driven towards the substrate 101 (and/or fin structure 112) at an angle with respect to the top surface 101*t* of the substrate (and/or first side surface 106*s*-1). In such cases, the angle may be in a range of about 45 degrees to about 90 degrees. The plasma treatment process with the reactive species driven towards the substrate 101 at the angle from about 45 degrees to about 90 degrees can enhance the selectivity of the formation of the passivation layer 143. In other words, the passivation layer 143 is formed on the surface 106*s*-2 but not substantially formed on the surface 106*s*-1 as a result of the angled plasma treatment. Furthermore, due to the angled plasma treatment and the narrow spacing between adjacent first semiconductor layers along the Z direction, the second semiconductor layers 108 are not substantially affected by the plasma treatment.

An exemplary decoupled plasma oxidation process may include exposing the semiconductor device structure 100 to a plasma formed from a pure $O_2$ gas, a pure $O_3$ gas), a gas mixture of $O_2$ and $O_3$ gas), a mixture of $O_2$ or $O_3$ gas) and a noble gas (e.g., He, Ne, Ar, Kr, Xe, Rn), a mixture of $O_2$ or $O_3$ gas) and hydrogen-containing gas, a mixture of $O_2$ or $O_3$ gas) and nitrogen-containing gas, a mixture of $O_2$ or $O_3$ gas), a noble gas, and nitrogen-containing gas, or a mixture of $O_2$ or $O_3$ gas), a noble gas, a nitrogen-containing gas, and a hydrogen-containing gas. The plasma may be formed by a capacitively coupled plasma (CCP) source or an inductively coupled plasma (ICP) source driven by an RF power generator. In cases where ICP source is used, the plasma treatment may be performed in a process chamber having a chamber wall, a ceiling, and a plasma source power applicator comprising a coil antenna disposed over the ceiling and/or around the chamber wall. The plasma source power applicator is coupled through an impedance match network to an RF power source, which may use a continuous wave RF power generator or a pulsed RF power generator operating on a predetermined duty cycle. In one embodiment, the decoupled plasma oxidation process is formed by the ICP source driven by the RF power generator using a tunable frequency ranging from about 2 MHz to about 13.56 MHz, and the chamber is operated at a pressure in a range of about 10 mTorr to about 1 Torr and a temperature of about 25 degrees Celsius to about 300 degrees Celsius for a process time of about 30 seconds to about 5 minutes. The RF power generator is operated to provide power between about 50 watts to about 1000 watts, and the output of the RF power generator is controlled by a pulse signal having a duty cycle in a range of about 20% to about 80%.

In cases where chlorine-based plasma is used, the passivation layer 143 may be formed on the second side surfaces 106*s*-2 of the first semiconductor layers 106 as a result of the plasma treatment. In such cases, the passivation layer 143 may be a silicon-containing layer comprising chlorine, and the thickness of the passivation layer 143 may be one atomic layer to several atomic layers. In some embodiments, the plasma treatment may convert at least a surface portion (e.g., surface portion 117*a-c* shown in FIGS. 9A-9C) of the first semiconductor layers 106 into an inhibitor region comprising chlorine. Additionally or alternatively, the chlorine of the passivation layer 143 may diffuse into the first semiconductor layers 106 during the subsequent manufacturing process (e.g., formation of the dielectric spacers 144). In either case, the surface portion of the first semiconductor layers 106 (e.g., the portion of the first semiconductor layers 106 to be in contact with the epitaxial S/D feature 146) may have about 0 atomic percentage of chlorine to about 10 atomic percentage of chlorine, such as about 2-8 atomic percentage of chlorine.

In cases where fluorine-based plasma is used, the passivation layer 143 may be formed on the second side surfaces 106*s*-2 of the first semiconductor layers 106 as a result of the plasma treatment. In such cases, the passivation layer 143 may be a silicon-containing layer comprising fluorine, and the thickness of the passivation layer 143 may be one atomic layer to several atomic layers. In some embodiments, the plasma treatment may convert at least a surface portion (e.g., surface portion 117*a-c* shown in FIGS. 9A-9C) of the first semiconductor layers 106 into an inhibitor region comprising fluorine. Additionally or alternatively, the fluorine of the passivation layer 143 may diffuse into the first semiconductor layers 106 during the subsequent manufacturing process (e.g., formation of the dielectric spacers 144). In either case, the surface portion of the first semiconductor layers 106 (e.g., the portion of the first semiconductor layers 106 to be in contact with the epitaxial S/D feature 146) may have about 0 atomic percentage of fluorine to about 10 atomic percentage of fluorine, such as about 2-8 atomic percentage of fluorine.

Figure 8D:
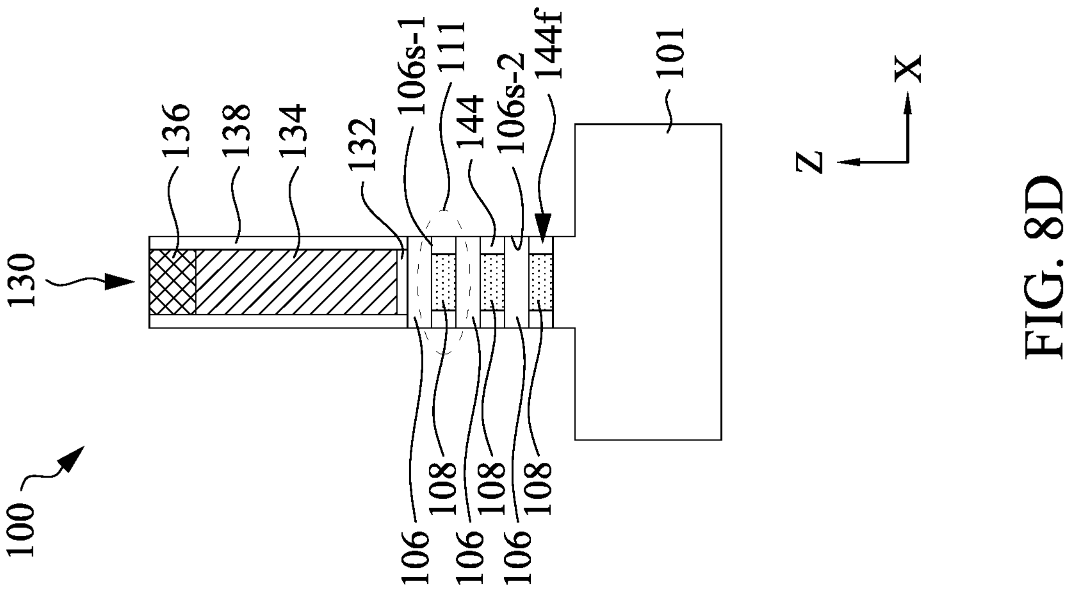
Figure 8C:
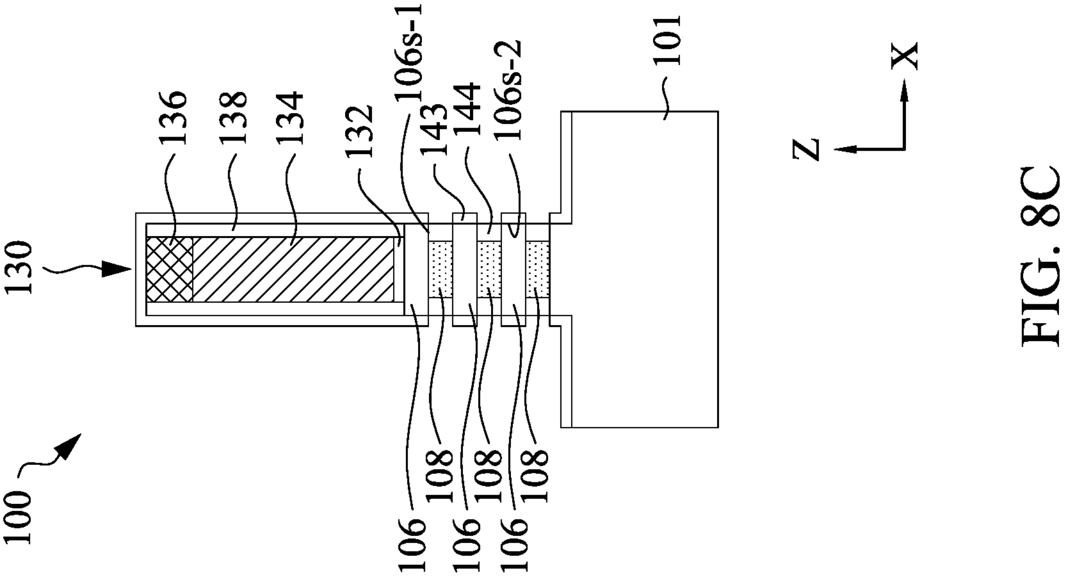

In FIG. 8C, after forming the passivation layer 143, a dielectric layer is deposited in the cavities 141 (FIG. 8B) to form dielectric spacers (or so-called inner spacers) 144. The passivation layer 143 enables selective deposition of the dielectric spacers 144 on the exposed surfaces of the second semiconductor layer 108 and the first side surface 106*s*-1 of the first semiconductor layers 106. As a result, the gap fill capability of the dielectric spacers 144 is improved. The dielectric spacers 144 may be made of a low-K dielectric material, such as SiON, SiCN, SiOC, SiOCN, or SiN. In some embodiments, the dielectric spacers 144 are formed of a material have a k value in a range of 3.5 to 5.5. The dielectric spacers 144 may be formed by ALD, pulsed plasma CVD, or any suitable deposition process. The remaining second semiconductor layers 108 are capped between the dielectric spacers 144 along the X direction.

In FIG. 8D, after the dielectric spacers 144 are formed, a removal process (e.g., dry etch, wet etch, or a combination thereof) may be performed to remove the passivation layers 143 formed on the second side surfaces 106*s*-2 of the first semiconductor layers 106, while the dielectric spacers 144 are not substantially affected by the removal process. Any passivation layer 143 on the first side surfaces 106*s*-1 of the first semiconductor layers 106 may also be removed during the removal process. The removal process may be an isotropic or anisotropic etch process. In one exemplary embodiment, the removal process is an isotropic etch process using a solution of diluted hydrofluoric acid (dHF) (having a ratio of water to HF in a range from about 50:1 to about 500:1), phosphoric acid ($H_3PO_4$), or $H_3PO_4$ and dHF. The removal process may be performed for about 15 seconds to about 50 seconds, for example about 35 seconds and can be repetitive if needed. Alternatively, the passivation layer 143 formed on the first semiconductor layers 106 can be removed during the subsequent S/D pre-clean process.

Upon removal of the passivation layer 143, end portions of the dielectric spacers 144 under the first semiconductor layers 106 may have flat surfaces 144*f* which are substantially flush with the second side surface 106*s*-2 of the first semiconductor layers 106, as shown in FIG. 8D.

Figure 9C:
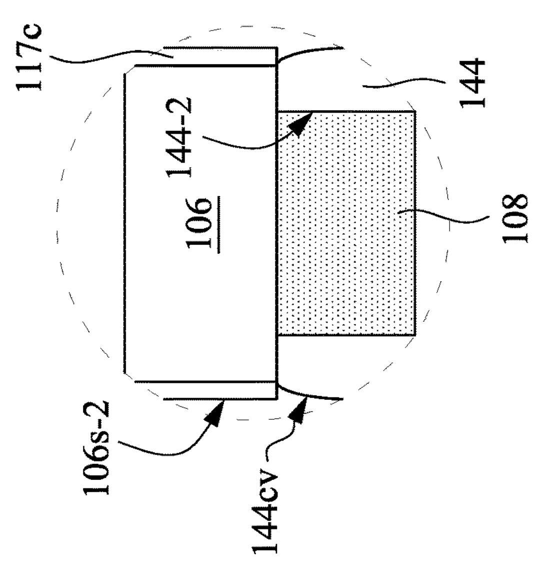
FIGS. 9A-9C are enlarged views of a portion of the semiconductor device structure of FIG. 8D in accordance with some embodiments.
Figure 9C:
Figure 9B:
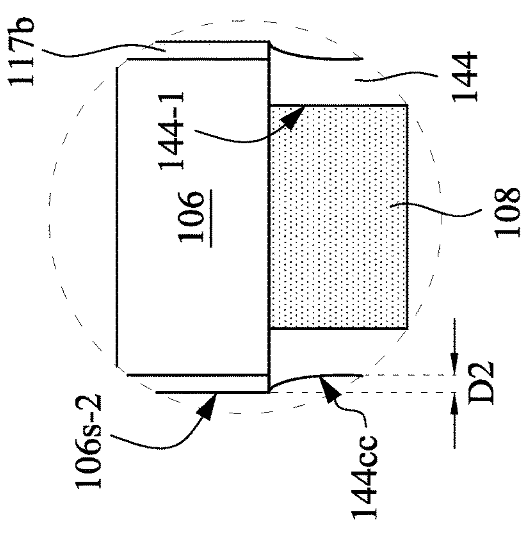
Figure 9A:
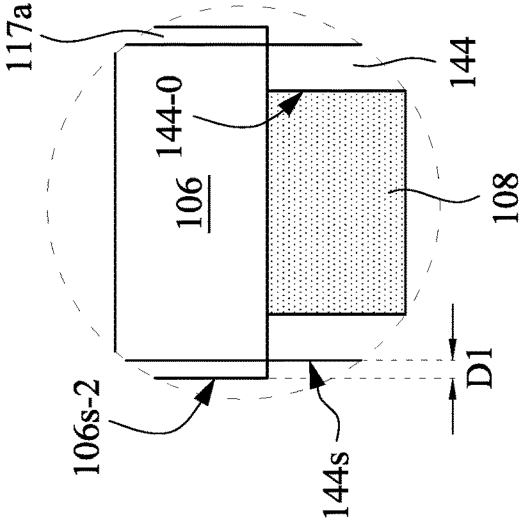

FIGS. 9A-9C are enlarged views of a portion 111 of the semiconductor device structure 100 of FIG. 8D showing the first and second semiconductor layers 106, 108 and the dielectric spacers 144 in accordance with some embodiments. In some embodiments shown in FIG. 9A, the dielectric spacers 144 have a first flat surface 144-0 in contact with the semiconductor layer 108 (which is to be replaced by a gate dielectric layer 170 shown in FIG. 14A). The end portions of the dielectric spacers 144 under the first semiconductor layers 106 may have a second flat surface 144*s* which is slightly horizontally etched. As a result, a distance D1, which is a lateral distance between the flat surface 144*s* of the dielectric spacers 144 and an imaginary line extending along the second side surface 106*s*-2 of the first semiconductor layers 106, is formed. In some examples, the distance D1 may be about 1.5 nm or less, such as about 0.5 nm to about 1 nm.

Figures 10A, 10B, 10C:
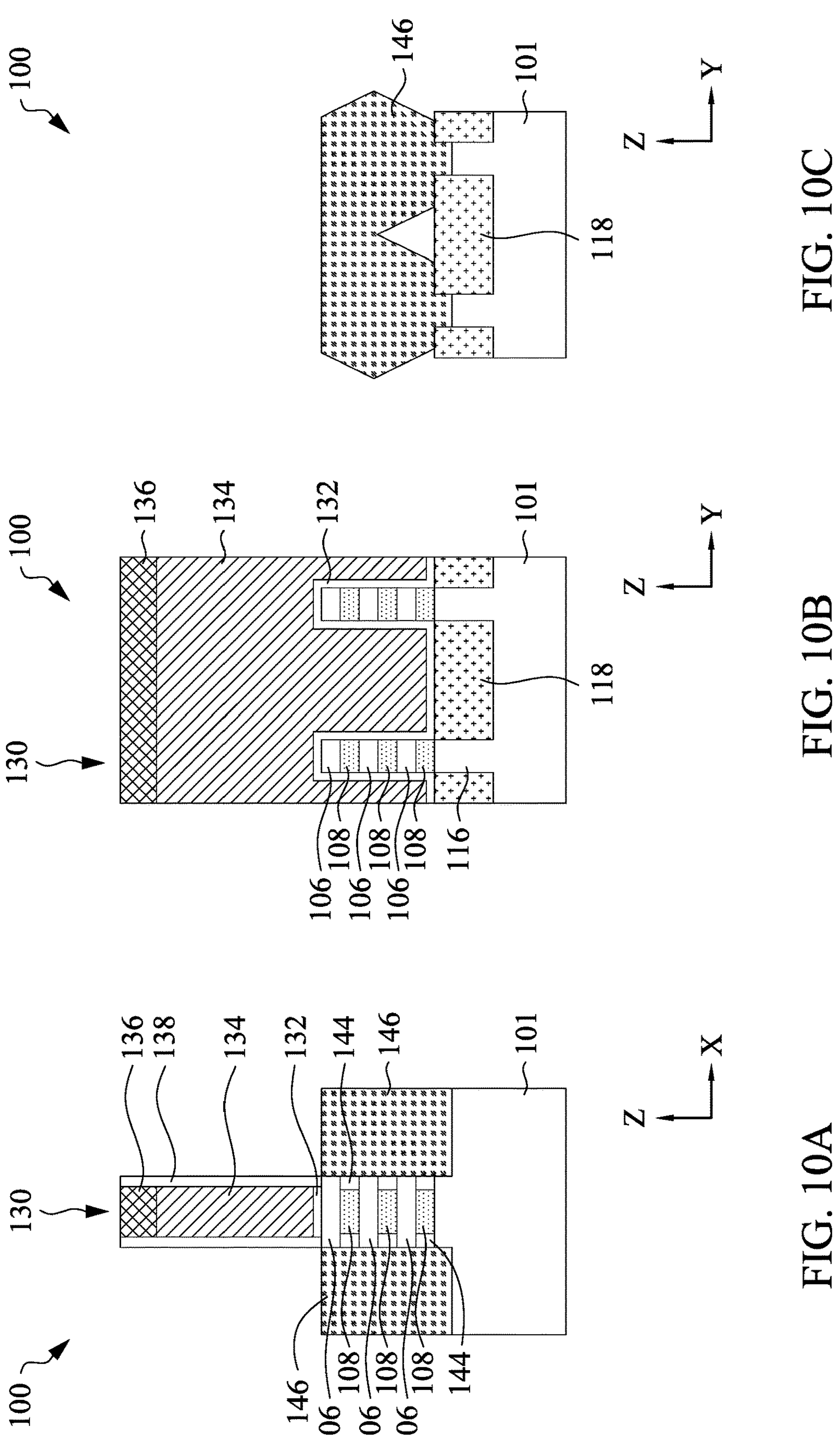

The exposed surface of the dielectric spacers 144 may have a different profile after the removal of the passivation layers 143. In some embodiments, end portions of the dielectric spacers 144 under the first semiconductor layers 106 are horizontally etched to have a curved surface. In one example as shown in FIG. 9B, the end portions of the dielectric spacers 144 have a concave surface 144*cc* after the removal of the passivation layers 143. In such cases, a distance D2, which is a lateral distance between a lowest point of the concave surface 144*cc* and an imaginary line extending along the second side surface 106*s*-2 of the first semiconductor layer 106, may be about 1.5 nm or less, such as about 0.5 nm to about 1 nm. The dielectric spacer 144 in FIG. 9B has a first surface 144-1 in contact with the second semiconductor layer 108 (which is to be replaced by a gate dielectric layer 170 shown in FIG. 14A) and a second surface 144*cc* which is to be in contact with an epitaxial S/D feature 146 (FIG. 10A). In some embodiments, the second surface 144*cc* may not contact the epitaxial S/D feature 146.

In some embodiments, end portions of the dielectric spacers 144 under the first semiconductor layers 106 are horizontally etched to have a curved surface. In one example as shown in FIG. 9C, the end portions of the dielectric spacers 144 have a convex surface 144*cv*. Likewise, the dielectric spacer 144 has a first surface 144-2 in contact with the second semiconductor layer 108 (which is to be replaced by the gate dielectric layer 170 shown in FIG. 14A) and a second surface 144*cv* which is to be in contact with an epitaxial S/D feature 146 (FIG. 10A). In some embodiments, the second surface 144*cv* may not contact the epitaxial S/D feature 146.

FIGS. 10A-15A are cross-sectional side views of various stages of manufacturing the semiconductor device structure 100 taken along cross-section A-A of FIG. 6, in accordance with some embodiments. FIGS. 10B-15B are cross-sectional side views of various stages of manufacturing the semiconductor device structure 100 taken along cross-section B-B of FIG. 6, in accordance with some embodiments. FIG. 10C-15C are cross-sectional side views of various stages of manufacturing the semiconductor device structure 100 taken along cross-section C-C of FIG. 6, in accordance with some embodiments. As shown in FIGS. 10A and 10C, epitaxial S/D features 146 are formed in the source/drain (S/D) regions. The epitaxial S/D features 146 may be made of one or more layers of Si, SiP, SiC and SiCP for n-channel FETs or Si, SiGe, Ge for p-channel FETs. For p-channel FETs, p-type dopants, such as boron (B), may also be included in the epitaxial S/D features 146. The epitaxial S/D features 146 may be formed by an epitaxial growth method using CVD, ALD or MBE. The epitaxial S/D features 146 may grow both vertically and horizontally to form facets, which may correspond to crystalline planes of the material used for the substrate 101. In some cases, the epitaxial S/D features 146 of a fin structure may grow and merge with the epitaxial S/D features 146 of the neighboring fin structures, as one example shown in FIG. 10C.

In some embodiments, prior to formation of the S/D epitaxial features 146, a S/D pre-clean process may be performed to remove a native oxide layer that is formed on the first semiconductor layers 106 and the dielectric spacers 144. In cases where the passivation layers 143 were not removed previously, the S/D pre-clean process may remove the passivation layers 143 and any native oxide layer. The S/D pre-clean process may be an inert gas sputtering process (e.g., argon sputter) or a plasma-based cleaning process. In one embodiment, the S/D pre-clean process is a SiCoNi process which uses a remote plasma source to generate ammonium fluoride ($NH_4F$) etchant species from nitrogen trifluoride ($NF_3$) and ammonia ($NH_3$) to minimize the damage to the semiconductor device structure 100.

In one example shown in FIG. 10A, one of a pair of epitaxial S/D features 146 disposed on one side of the sacrificial gate structure 130 is designated as a source feature/terminal, and the other of the pair of epitaxial S/D features 146 disposed on the other side of the sacrificial gate structure 130 is designated as a drain feature/terminal. The source feature/terminal and the drain feature/terminal are connected by the channel layers (e.g., the first semiconductor layers 106). The epitaxial S/D features 146 are in contact with the first semiconductor layer 106 under the sacrificial gate structure 130. In some cases, the epitaxial S/D features 146 may grow pass the topmost semiconductor channel, i.e., the first semiconductor layer 106 under the sacrificial gate structure 130, to be in contact with the gate spacers 138. The second semiconductor layer 108 under the sacrificial gate structure 130 are separated from the epitaxial S/D features 146 by the dielectric spacers 144.

Figures 11A, 11B, 11C:
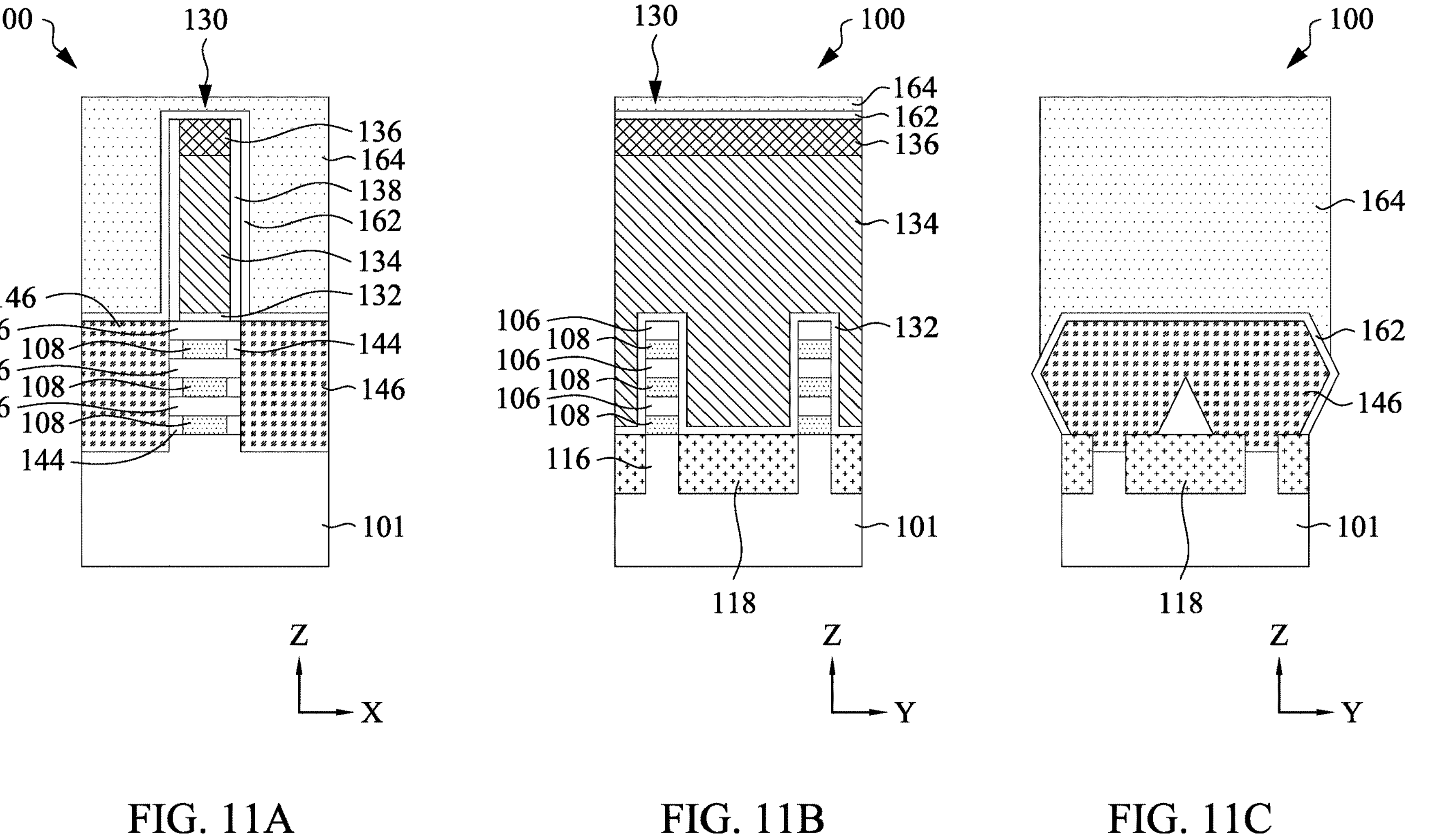

In FIGS. 11A-11C, a contact etch stop layer (CESL) 162 is conformally formed on the exposed surfaces of the semiconductor device structure 100. The CESL 162 covers the sidewalls of the sacrificial gate structure 130, the insulating material 118, the epitaxial S/D features 146, and the exposed surface of the stack of semiconductor layers 104. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, a first interlayer dielectric (ILD) layer 164 is formed on the CESL 162 over the semiconductor device structure 100. The materials for the first ILD layer 164 may include compounds comprising Si, 0, C, and/or H, such as silicon oxide, TEOS oxide, SiCOH and SiOC. Organic materials, such as polymers, may also be used for the first ILD layer 164. The first ILD layer 164 may be deposited by a PECVD process or other suitable deposition technique. In some embodiments, after formation of the first ILD layer 164, the semiconductor device structure 100 may be subject to a thermal process to anneal the first ILD layer 164.

Figures 12A, 12B, 12C:
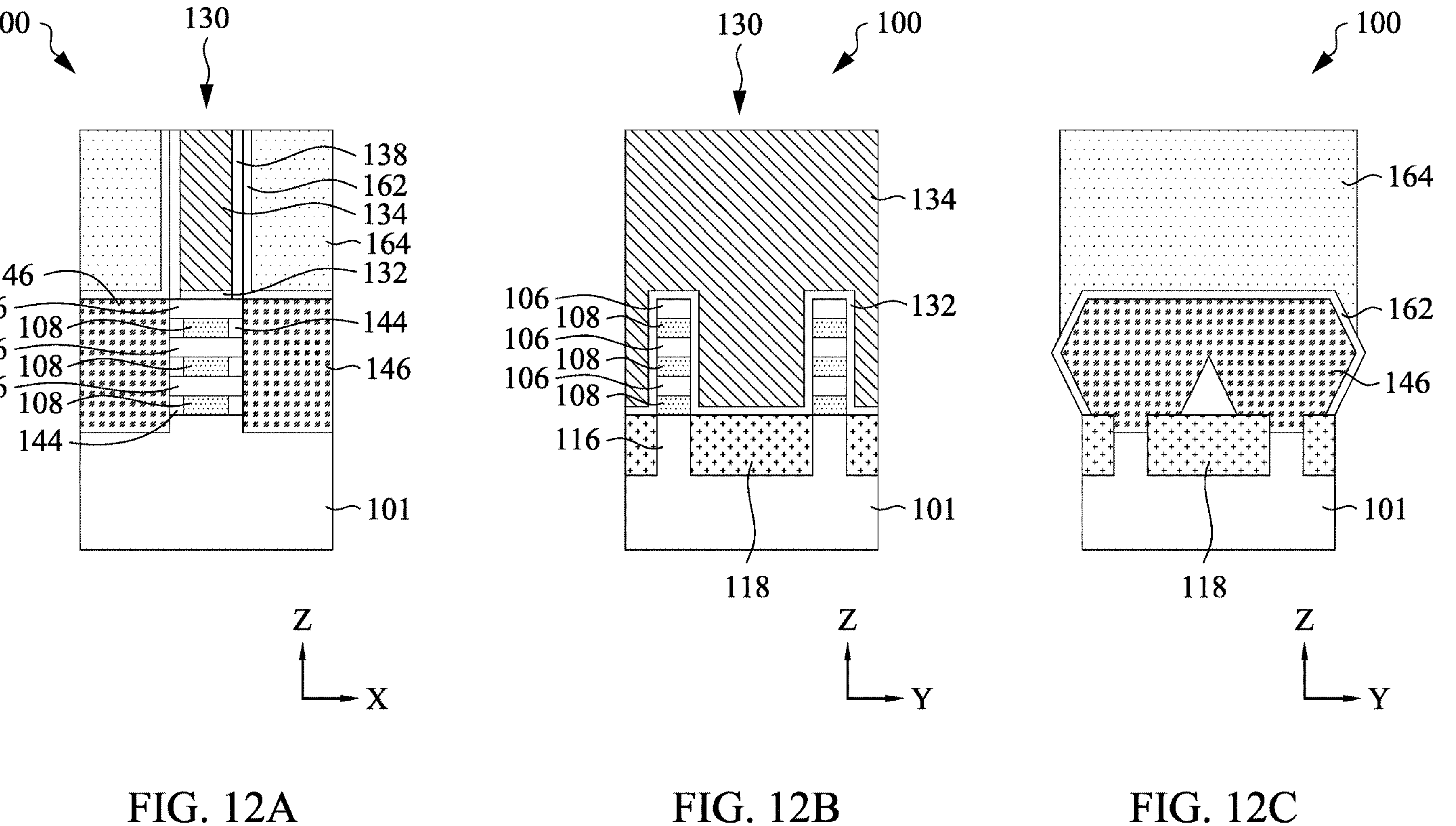

In FIGS. 12A-12C, after the first ILD layer 164 is formed, a planarization operation, such as CMP, is performed on the semiconductor device structure 100 until the sacrificial gate electrode layer 134 is exposed.

Figures 13A, 13B, 13C:
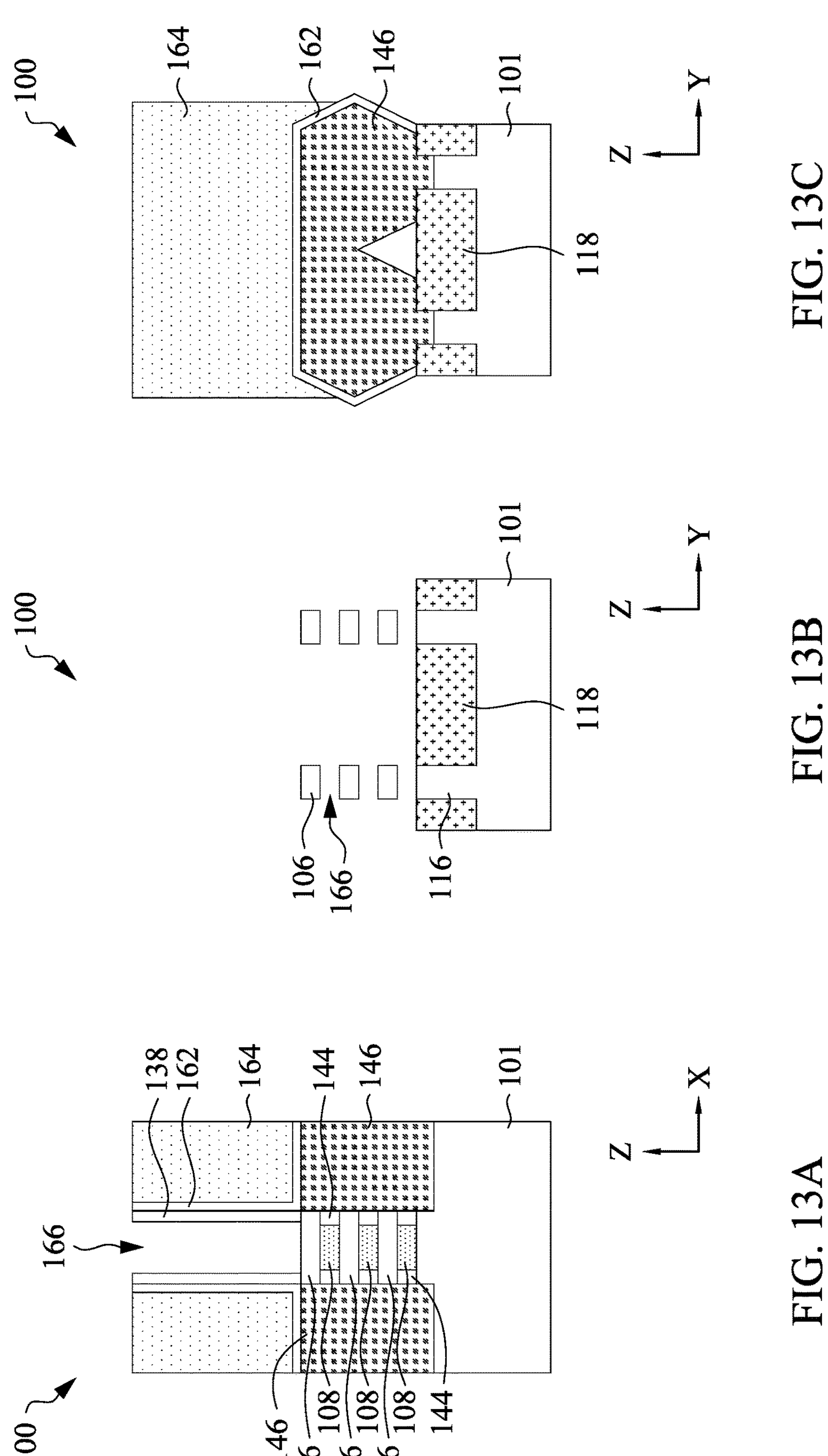

In FIGS. 13A-13C, the sacrificial gate structure 130 and the second semiconductor layers 108 are removed. The removal of the sacrificial gate structure 130 and the semiconductor layers 108 forms an opening 166 between gate spacers 138 and between first semiconductor layers 106. The ILD layer 164 protects the S/D epitaxial features 146 during the removal processes. The sacrificial gate structure 130 can be removed using plasma dry etching and/or wet etching. The sacrificial gate electrode layer 134 may be first removed by any suitable process, such as dry etch, wet etch, or a combination thereof, followed by the removal of the sacrificial gate dielectric layer 132, which may also be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the gate spacers 138, the dielectric material 125, the ILD layer 164, and the CESL 162.

Portions of the second semiconductor layers 108 may be removed using a selective wet etching process. In cases where the second semiconductor layers 108 are made of SiGe and the first semiconductor layers 106 are made of Si, the chemistry used in the selective wet etching process removes the SiGe while not substantially affecting Si, the dielectric materials of the gate spacers 138, and the dielectric spacers 144. In one embodiment, the second semiconductor layers 108 can be removed using a wet etchant such as, but not limited to, hydrofluoric (HF), nitric acid ($HNO_3$), hydrochloric acid (HCl), phosphoric acid ($H_3PO_4$), a dry etchant such as fluorine-based (e.g., $F_2$) or chlorine-based gas (e.g., $Cl_2$), or any suitable isotropic etchants.

Figures 14A, 14B, 14C:
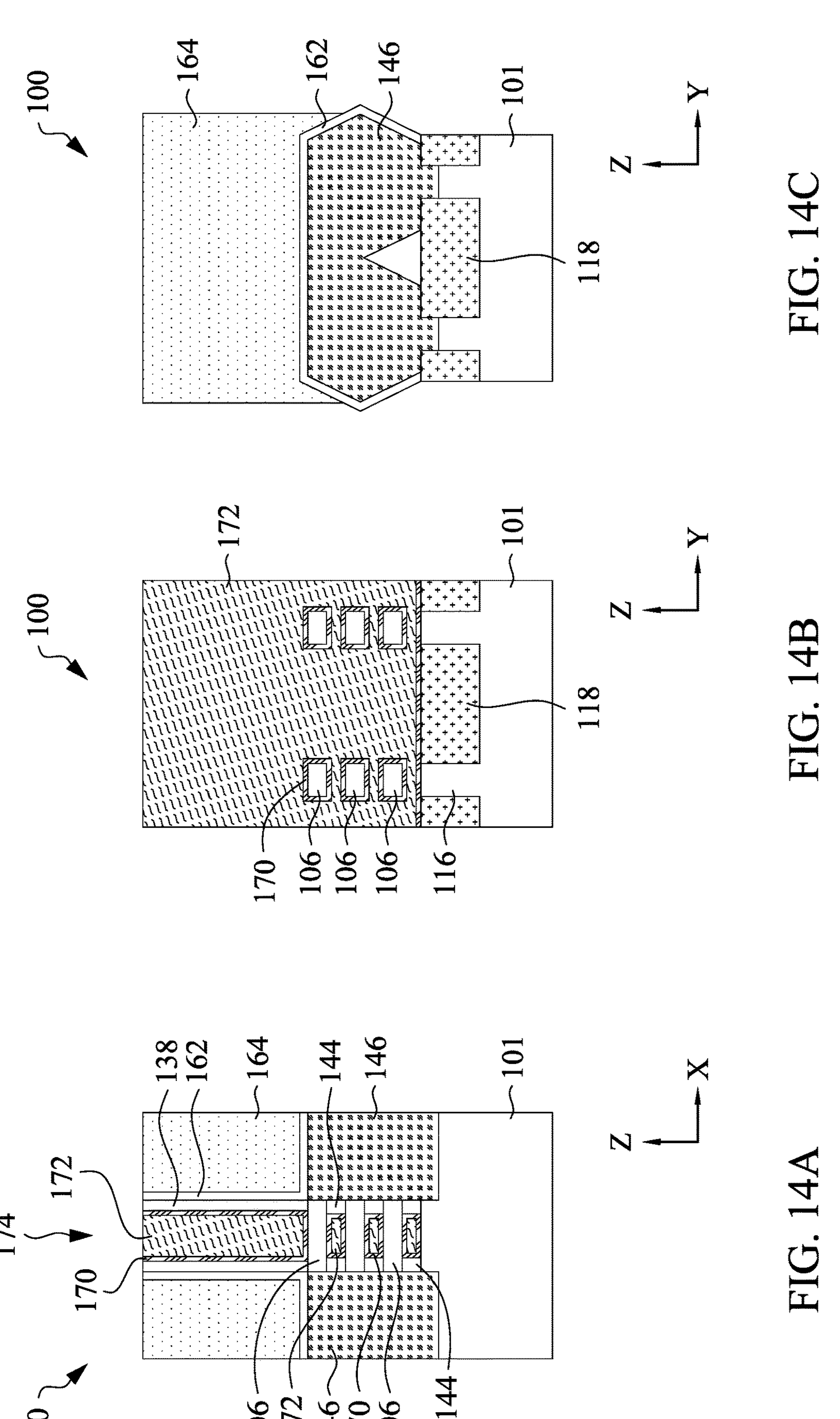

In FIGS. 14A-14C, after the formation of the nanostructure channels (i.e., the exposed first semiconductor layers 106), a gate dielectric layer 170 is formed to surround the first semiconductor layers 106, and a gate electrode layer 172 is formed on the gate dielectric layer 170. The gate dielectric layer 170 and the gate electrode layer 172 may be collectively referred to as a gate structure 174. In some embodiments, an interfacial layer (IL) (not shown) is formed between the gate dielectric layer 170 and the exposed surfaces of the first semiconductor layers 106. In such cases, the IL may also form on the well portion 116 of the substrate 101. The IL may include or be made of an oxygen-containing material or a silicon-containing material, such as silicon oxide, silicon oxynitride, oxynitride, hafnium silicate, etc. The IL may be formed by CVD, ALD, a clean process, or any suitable process. In some embodiments, the gate dielectric layer 170 includes one or more layers of a dielectric material, such as silicon oxide, silicon nitride, or high-K dielectric material, other suitable dielectric material, and/or combinations thereof. Examples of high-K dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-K dielectric materials, and/or combinations thereof. The gate dielectric layer 170 may be formed by CVD, ALD or any suitable deposition technique.

The gate electrode layer 172 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or any combinations thereof. The gate electrode layer 172 may be formed by CVD, ALD, electro-plating, or other suitable deposition technique. The gate electrode layer 172 may be also deposited over the upper surface of the first ILD layer 164. The gate dielectric layer 170 and the gate electrode layer 172 formed over the first ILD layer 164 are then removed by using, for example, CMP, until the top surface of the first ILD layer 164 is exposed.

Figures 15A, 15B, 15C:
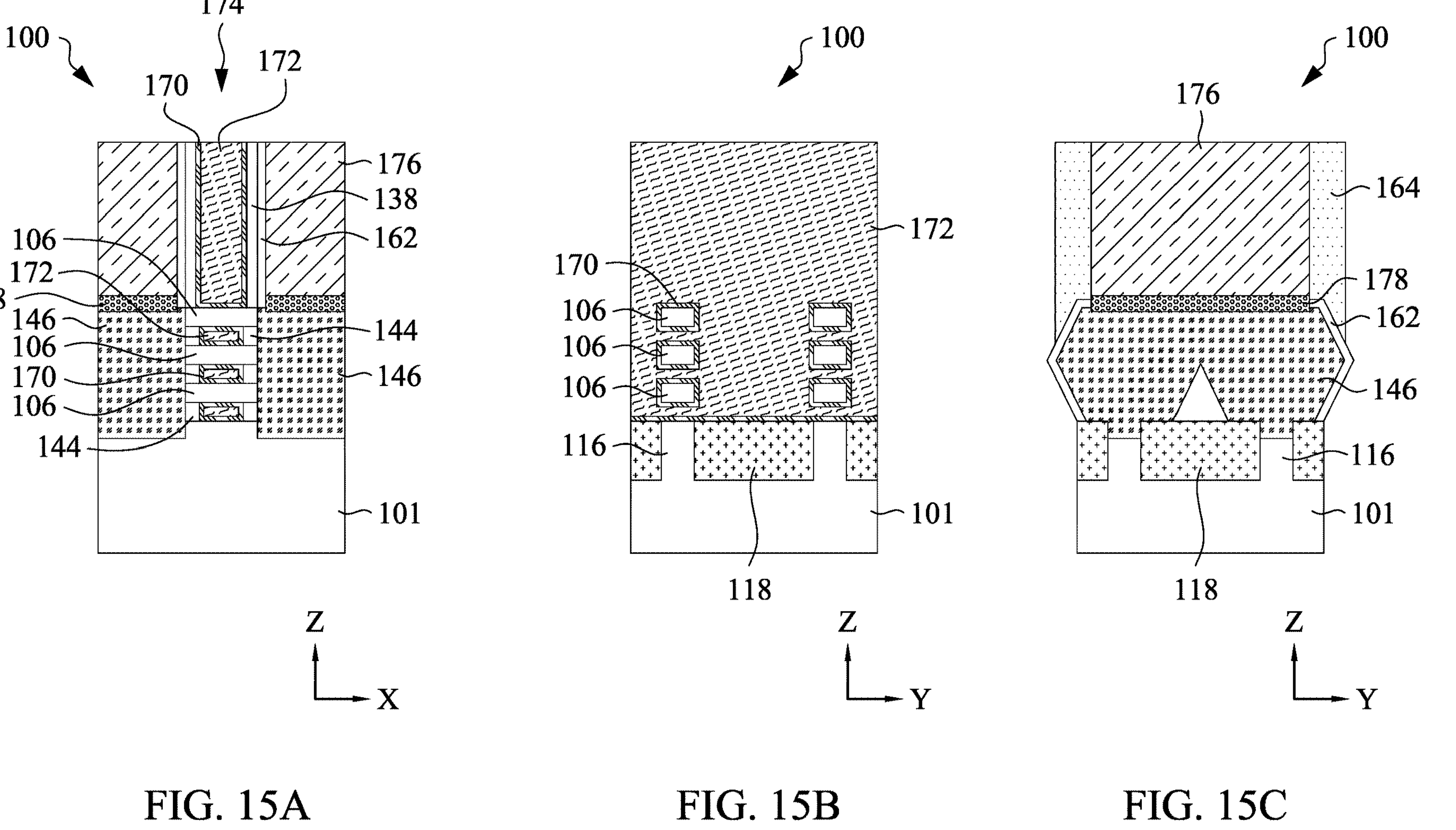

In FIGS. 15A-15C, source/drain (S/D) contacts 176 are formed in the first ILD layer 164. Prior to forming the S/D contacts 176, contact openings are formed in the first ILD layer 164 to expose the epitaxial S/D features 146. Suitable photolithographic and etching techniques are used to form the contact openings through various layers, including the first ILD layer 164 and the CESL 162 to expose the epitaxial S/D features 146. In some embodiments, the upper portions of the epitaxial S/D features 146 are etched.

After the formation of the contact openings, a silicide layer 178 is formed on the epitaxial S/D features 146. The silicide layer 178 conductively couples the epitaxial S/D features 146 to the subsequently formed S/D contacts 176. The silicide layer 178 may be formed by depositing a metal source layer over the epitaxial S/D features 146 and performing a rapid thermal annealing process. During the rapid anneal process, the portion of the metal source layer over the epitaxial S/D features 146 reacts with silicon in the epitaxial S/D features 146 to form the silicide layer 178. Unreacted portion of the metal source layer is then removed. In some embodiments, the silicide layer 178 is made of a metal or metal alloy silicide, and the metal includes a noble metal, a refractory metal, a rare earth metal, alloys thereof, or combinations thereof. Next, a conductive material is formed in the contact openings and form the S/D contacts 176. The conductive material may be made of a material including one or more of Ru, Mo, Co, Ni. W, Ti, Ta, Cu, Al, TiN and TaN. While not shown, a barrier layer (e.g., TiN, TaN, or the like) may be formed on sidewalls of the contact openings prior to forming the S/D contacts 176. Then, a planarization process, such as CMP, is performed to remove excess deposition of the contact material and expose the top surface of the gate electrode layer 172.

It is understood that the semiconductor device structure 100 may undergo further complementary metal oxide semiconductor (CMOS) and/or back-end-of-line (BEOL) processes to form various features such as transistors, contacts/vias, interconnect metal layers, dielectric layers, passivation layers, etc. The semiconductor device structure 100 may also include backside contacts (not shown) on the backside of the substrate 101 so that either source or drain of the epitaxial S/D features 146 is connected to a backside power rail (e.g., positive voltage VDD or negative voltage VSS) through the backside contacts.

Embodiments of the present disclosure provide an approach to minimize damage to inner spacers of gate all around (GAA) transistors, such as nanostructure FETs. The nanostructure FET generally includes a stack of first and second semiconductor layers formed over a substrate. The second semiconductor layers are interposed between the first semiconductor layers, which form nanostructure channels of the nanostructure FETs. Portions of the second semiconductor layers are recessed laterally during formation of the nanostructure FETs to provide cavities for the inner spacers, which are formed between metal gates and epitaxial S/D features for reduction of parasitic fringing capacitance. Prior to formation of the inner spacers, a passivation layer is formed on sidewall surfaces of the first semiconductor layers by a plasma treatment. The passivation layer allows selective deposition of the subsequent dielectric spacers in the cavities and thus enhanced gap fill capability of the inner spacers. The passivation layer can be easily removed, resulting in less damage to the dielectric spacers.

An embodiment is a method for forming a semiconductor device structure. The method includes forming a fin structure having first semiconductor layers and second semiconductor layers alternatingly stacked, removing edge portions of the second semiconductor layers to form cavities between adjacent first semiconductor layers, selectively forming a passivation layer on sidewalls of the first semiconductor layers, forming a dielectric spacer on sidewalls of the second semiconductor layers and filling in the cavities, wherein the passivation layer is exposed. The method also includes removing the passivation layer, and forming an epitaxial source/drain feature so that the epitaxial source/drain feature is in contact with the first semiconductor layers and the dielectric spacers.

Another embodiment is a method for forming a semiconductor device structure. The method includes forming a fin structure on a substrate, the fin structure comprising first semiconductor layers and second semiconductor layers alternatingly stacked, forming a sacrificial gate structure over a portion of the fin structure, removing the first and second semiconductor layers in a source/drain region of the fin structure that is not covered by the sacrificial gate structure, removing edge portions of the second semiconductor layers, subjecting the first semiconductor layers and the substrate to a plasma treatment, forming dielectric spacers on sidewalls of the second semiconductor layers and in between adjacent first semiconductor layers, forming an epitaxial source/drain feature in the source/drain region, removing portions of the sacrificial gate structure to expose the first and second semiconductor layers, removing the second semiconductor layers, forming a gate dielectric layer to surround exposed surface of each first semiconductor layer, and forming a gate electrode layer on the gate dielectric layer.

An one further embodiment is a method for forming a semiconductor device structure. The method includes forming a first source/drain epitaxial feature over a substrate, forming a second source/drain epitaxial feature over the substrate, forming two or more semiconductor layers between the first source/drain epitaxial feature and the second source/drain epitaxial feature, wherein each of the two or more semiconductor layers has a surface portion comprising a halogen. The method also includes forming a gate dielectric layer to surround a portion of one of the two or more semiconductor layers, forming a gate electrode layer on the gate dielectric layer, and forming a dielectric spacer between the semiconductor layers, wherein the dielectric spacer comprises a first surface in contact with the gate dielectric layer, and a second surface adjacent the first source/drain epitaxial feature, and wherein the second surface has a curved profile.

A further yet embodiment is a semiconductor device structure. The structure includes a first source/drain epitaxial feature formed over a substrate, a second source/drain epitaxial feature formed over the substrate, two or more semiconductor layers disposed between the first source/drain epitaxial feature and the second source/drain epitaxial feature, wherein each of the two or more semiconductor layers has a surface portion comprising a halogen. The structure also includes a gate dielectric layer surrounding a portion of one of the two or more semiconductor layers, a gate electrode layer formed on the gate dielectric layer, and a dielectric spacer disposed between the semiconductor layers. The dielectric spacer includes a first surface in contact with the gate dielectric layer, and a second surface disposed adjacent the first source/drain epitaxial feature, the second surface having a curved profile.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device structure, comprising:

forming a fin structure having first semiconductor layers and second semiconductor layers alternatingly stacked;

removing edge portions of the second semiconductor layers to form cavities between adjacent first semiconductor layers;

selectively forming a passivation layer on sidewalls of the first semiconductor layers;

forming dielectric spacers on sidewalls of the second semiconductor layers and filling in the cavities, wherein the passivation layer is exposed;

removing the passivation layer; and forming an epitaxial source/drain feature so that the epitaxial source/drain feature is in contact with the first semiconductor layers and the dielectric spacers.

2. The method of claim 1, wherein the passivation layer is an oxide layer formed by a decoupled plasma oxidation process.

3. The method of claim 2, further comprising:

applying a bias power to the fin structure.

4. The method of claim 1, wherein the passivation layer is a silicon-containing layer comprising chlorine.

5. The method of claim 1, wherein the passivation layer is a silicon-containing layer comprising fluorine.

6. The method of claim 1, wherein end portions of the dielectric spacers are horizontally etched to have a curved surface after the removal of the passivation layer.

7. The method of claim 1, wherein end portions of the dielectric spacers are horizontally etched to have a concave or convex surface after the removal of the passivation layer.

8. The method of claim 1, wherein end portions of the dielectric spacers are horizontally etched to have a flat surface, and a lateral distance is formed between the flat surface and a line extending along the sidewalls of the first semiconductor layers.

9. The method of claim 8, wherein the lateral distance is about 1.5 nm or less.

10. A method for forming a semiconductor device structure, comprising:

forming a fin structure on a substrate, the fin structure comprising first semiconductor layers and second semiconductor layers alternatingly stacked;

forming a sacrificial gate structure over a portion of the fin structure;

removing the first and second semiconductor layers in a source/drain region of the fin structure that is not covered by the sacrificial gate structure;

removing edge portions of the second semiconductor layers;

subjecting the first semiconductor layers and the substrate to a plasma treatment to selectively form a passivation layer on sidewalls of the first semiconductor layers;

forming dielectric spacers on sidewalls of the second semiconductor layers and in between adjacent first semiconductor layers;

forming an epitaxial source/drain feature in the source/drain region;

removing portions of the sacrificial gate structure to expose the first and second semiconductor layers;

removing the second semiconductor layers;

forming a gate dielectric layer to surround an exposed surface of each first semiconductor layer; and forming a gate electrode layer on the gate dielectric layer.

11. The method of claim 10, wherein the plasma treatment converts at least a surface portion of the first semiconductor layers into a dielectric region.

12. The method of claim 11, wherein the plasma treatment is performed by exposing the first semiconductor layers to an oxygen-based plasma.

13. The method of claim 10, wherein the plasma treatment converts at least a surface portion of the first semiconductor layers into an inhibitor region comprising a halogen.

14. The method of claim 13, wherein the plasma treatment is performed by exposing the first semiconductor layers to a chlorine-based plasma.

15. The method of claim 13, wherein the plasma treatment is performed by exposing the first semiconductor layers to a fluorine-based plasma.

16. The method of claim 10, wherein the plasma treatment is controlled so that reactive species are driven towards a top surface of the substrate at an angle between about 45 degrees to about 90 degrees.

17. A method for forming a semiconductor device structure, comprising:

forming a first source/drain epitaxial feature over a substrate;

forming a second source/drain epitaxial feature formed over the substrate;

forming two or more semiconductor layers between the first source/drain epitaxial feature and the second source/drain epitaxial feature, wherein each of the two or more semiconductor layers has a surface portion comprising a halogen;

forming a gate dielectric layer to surround a portion of one of the two or more semiconductor layers;

forming a gate electrode layer on the gate dielectric layer; and forming a dielectric spacer between the semiconductor layers, wherein the dielectric spacer comprises:

a first surface in contact with the gate dielectric layer; and a second surface adjacent the first source/drain epitaxial feature, the second surface having a curved profile.

18. The method of claim 17, wherein the second surface has a concave or convex profile.

19. The method of claim 17, wherein the surface portion comprises about 2 atomic percentage of chlorine to about 8 atomic percentage of chlorine.

20. The method of claim 17, wherein the surface portion comprises about 2 atomic percentage of fluorine to about 8 atomic percentage of fluorine.

* * * * *